United States Patent [19]

Dalman et al.

[11] Patent Number: 4,680,538

[45] Date of Patent: Jul. 14, 1987

[54] MILLIMETER WAVE VECTOR NETWORK ANALYZER

[75] Inventors: G. Conrad Dalman; Hiroshi Kondoh, both of Ithaca, N.Y.

[73] Assignee: Cornell Research Foundation, Inc., Ithaca, N.Y.

[21] Appl. No.: 691,613

[22] Filed: Jan. 15, 1985

[51] Int. Cl.[4] .......................................... G01R 27/04

[52] U.S. Cl. .............................. 324/58 R; 324/58 A; 324/58 B

[58] Field of Search ............ 333/121, 122; 324/58 R, 324/58 A, 58 B

[56] References Cited

PUBLICATIONS

HP: "Automatic Network Analyzer" hp8542A, Section IV—pp. 2 and 3—(circa 1976).

Engen, Glenn F., "An Improved Circuit for Implementing the Six-Port Technique of Microwave Measurements," IEE Transactions on Microwave Theory and Techniques, V. MIT-25, No. 12, Dec. 1977, pp. 1080-1083.

Weidman, Manly P., "A Semiautomated Six Port for Measuring Millimeter-Wave Power and Complex Reflection Coefficient," IEE Transactions on Microwave Theory and Techniques, V. MIT-25, Dec. 1977, pp. 1083-1085.

Cronson, et al., Harry M., "A Six-Port Automatic Network Analyzer," IEE Transactions on Microwave Theory and Techniques, V. MIT-25, No. 12, Dec. 1977, pp. 1086-1091.

Engen, Glenn F., "Calibrating the Six-Port Reflectometer by Means of Sliding Terminations," IEEE Transactions on Microwave Theory and Techniques, V. MI-T-26, No. 12, Dec. 1978, pp. 951-957.

Somlo, et al., P. I., "A Six-Port Reflectometer and Its Complete Characterization by Convenient Calibration Procedures," IEE Transactions on Microwave Theory and Techniques, V. MIT-30, No. 2, Feb. 1982, pp. 186-192.

Paul, Jeffrey A., "Wideband Millimeter-Wave Impedance Measurements," Apr. 1983, pp. 95-102, *Microwave Journal.*

*Primary Examiner*—Reinhard J. Eisenzopf

*Assistant Examiner*—Jose M. Solis

*Attorney, Agent, or Firm*—Jones, Tullar & Cooper

[57] ABSTRACT

A vector network analyzer system for measuring the complex impedance of devices and components at millimeter wavelengths is disclosed. A pair of directional couplers provide samples of the signal incident on and reflected from the element under test through reference and test channels, respectively. A 180° hybrid, or magic tee, device receives the samples, mixes them vectorially, and produces outputs to two power detectors which provide amplitude and phase information about the complex reflection coefficient. Similar measurements are obtained for the complex transmission coefficient. A 90° phase shifter consisting of a second magic tee and a PIN diode is connected in the reference channel to eliminate a phase measurement ambiguity. A computer processes the power detector output to determine the value of the unknown impedence. An electronically swept signal source allows measurements to be made automatically over a wide frequency band.

21 Claims, 6 Drawing Figures

MILLIMETER WAVE VECTOR NETWORK ANALYZER

BACKGROUND OF THE INVENTION

The present invention arose out of research sponsored by the Naval Ocean Systems Center under Grant No. N66001-83-C-0363. The United States Government may have rights under this invention.

With the expansion of communications into higher frequency bands in order to provide greater resolution for systems such as radar, data transmission, and the like, interest has extended into the millimeter wavelength range of frequencies, and particularly into frequencies in the range of 20 to 50 gigaHertz (GHz). Recent developments indicate a strong future for such frequencies.

The current activities in millimeter wave research has stimulated a demand for fast, low-cost, reliable and accurate equipment for the measurement of complex reflection and transmission coefficients, or impedance characteristics, of components and devices used in millimeter wave systems. These characteristics must be measured over a wide range of frequencies with accuracy and reliability.

Several millimeter wave network analyzers are presently available, such devices including an automatic scaler network analyzer, an impedance bridge device, a six-port network analyzer, and a down-converter network analyzer. (See J. A. Paul, "Wide Band Millimeter-wave Impedance Measurements," *Microwave Journal*, pages 95–102, April 1983.) The automatic scaler network analyzer is commercially available for operation up to 100 GHz and although the unit can measure the magnitude of both reflection and transmission coefficients accurately and quickly on a swept frequency basis, phase information on the coefficients cannot be obtained.

Thus, there is a need for a low cost system for accurately measuring complex reflection and transmission coefficients on a swept frequency basis over a wide range of millimeter wave frequencies.

SUMMARY OF THE INVENTION

The present invention is directed to a swept-frequency network analyzer which is constructed of standard microwave passive components and a controlled frequency sweeper and is used to make both reflection and transmission measurements with only two power meters. The simplicity of this device is based on the use of a 180° hybrid, or "magic-tee" waveguide device, and allows accurate point-by-point measurements of device coefficients over a broad frequency band.

The network analyzer of the present invention includes a swept frequency source of millimeter wave energy which is supplied through first and second directional coupler main arms to an impedance element under test. The coupled arms of the directional couplers provide samples of the signal incident on and the signal reflected from (or transmitted through) the impedance element, respectively, the first directional coupler providing a reference voltage which is supplied to one arm of a magic tee device. An electronically controlled phase shifting structure consisting of a combination of a PIN diode with a second magic tee is inserted in the reference channel to provide a selectable 90-degree phase shift to eliminate a phase measurement ambiguity. Other forms of PIN phase shifters could be used in which a circulator or a 3 dB hybrid replaces the magic tee. A mechanically movable wave guide short circuit could also be used in place of the PIN diode, if desired. The second coupler samples the signal reflected from or transmitted through the impedance device under test and provides a test signal which is supplied to a second arm of the magic tee device. The magic tee device mixes the reference and the test signals and delivers power from each of its 180° colinear output arms to corresponding power detectors. Any type of power detector such as a thermistor or square-law crystal detector can be used.

The output voltages from the two power detectors are related to the reflection coefficient or the transmission coefficient of the device under test in accordance with known mathematical formulas, and accordingly these equations can be solved, preferably by a small digital computer, to obtain the magnitude and phase of the reflection or transmission coefficients, as well as the impedance of the device under test. The results of these computations may be presented on a CRT screen in the form of a Smith Chart or in tabular form, or hard copies may be provided using a suitable pen recorder and/or printer.

This device is low cost, yet is capable of providing accurate measurements of the characteristics of devices under test over a wide range of frequencies, using low cost, commercially available hardware and a very simple computer control for providing the frequency sweeping and calculations of the values being measured.

BRIEF DESCRIPTION OF THE DRAWINGS

The foregoing and additional objects, features and advantages of the present invention will become apparent from a consideration of the following detailed description of preferred embodiments thereof, taken in conjunction with the accompanying drawings, in which.

DESCRIPTION OF PREFERRED EMBODIMENTS

Figure 1:
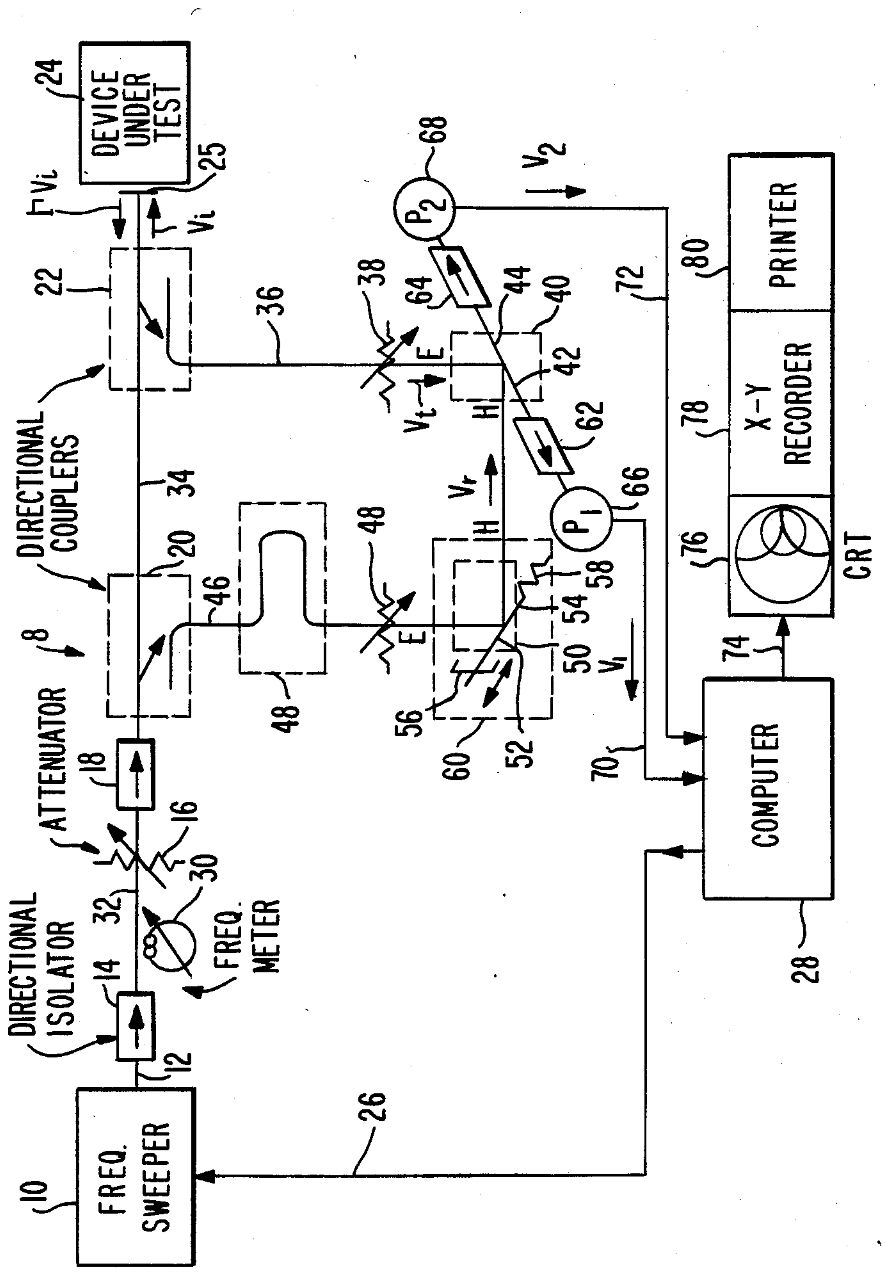
FIG. 1 is a schematic diagram of a vector network analyzer for reflection coefficient measurements in accordance with the present invention.

Turning now to a detailed consideration of the present invention, there is illustrated in FIG. 1 in schematic diagram form, a magic tee vector network analyzer 8 in accordance with the present invention. The analyzer, which is constructed from standard millimeter wave passive components and which uses a computer controlled signal generator which is swept across a frequency band of interest, can be used to make both reflection and transmission measurements, but for simplicity, FIG. 1 illustrates reflection measurements only. As shown, a controllable signal generator 10 generates an output signal of a selected millimeter wavelength frequency and supplies it to an output waveguide 12. The output signal is fed through a first directional isolator 14, an alternator 16, and a second directional isolator 18, and through a pair of directional couplers 20 and 22 to a device 24 to be tested, connected to a test port 25. The device under test may be any desired load such as a crystal detector or some other microwave component, the characteristics of which are to be tested at various frequencies.

The signal generator 10 is a conventional controllable generator which produces a complex output voltage at selected frequencies in the range of between about 18 and 100 GHz, with the specific frequency produced at any time being selected by an input signal on line 26 which may be supplied, for example, by a small digital computer 28, such as a PDP-11/04. A frequency meter 30 may be provided, for example, at a waveguide section 32 connected between the isolators 14 and 18 to provide an independent measurement of the output frequency of generator 10. Attenuator 16 may be placed in the waveguide 32 to permit adjustment of the amplitude of the output signal from the signal generator 10. The isolators 14 and 18 prevent reflected signals from a device under test from enetering the signal generator output.

The directional couplers 20 and 22 are connected in the waveguide section 34 which extends from isolator 18 to the device 24 under test, and are conventional, passive waveguide devices. Coupler 20 couples a part of the output voltage from signal generator 10 to provide a reference voltage, while the coupler 22 couples a portion of the signal reflected from the device under test to provide a test signal. The output from the signal generator 10 which reaches the device under test is a complex voltage $V_i$, while the microwave signal reflected from the device under test is a complex voltage $\Gamma V_i$ where T is the complex reflection coefficient of the device 24. The reflected signal is coupled by the directional coupler 22 into a test channel waveguide 36, passes through an adjustable attenuator 38 and is incident on the E-arm of a magic tee waveguide component 40. This incident voltage is the test signal, $V_t$. The magic tee 40 is a conventional, passive waveguide component having a pair of inlet arms E and H at right angles to each other, both inlet arms being perpendicular to the colinear outlet arms 42 and 44 of the device.

The directional coupler 20 supplies a portion of the incident voltage $V_i$ to a reference channel waveguide 46 which includes an extension arm 48 to equalize the path lengths of the reference and test signals. The signal in the reference channel 46 is fed through an adjustable attenuator 48 and is supplied to the E arm of a magic tee device 50. The colinear arms 52 and 54 of the magic tee 50 are connected to a movable waveguide short circuit 56 and to a terminating attenuator 58, respectively, to provide a 90° phase shift structure generally indicated at 60. The phase shifter 60 produces a reference signal $V_r$ at the output arm H of magic tee 50, $V_r$ being selectively shiftable 90 degrees from the incident voltage $V_i$ supplied to the device under test. The signal $V_r$ is supplied to the H arm of magic tee 40 and is also 90 degrees out of phase with the test voltage $V_t$. The reference and test voltages are mixed vectorially in the magic tee 40, which then delivers power from each of its colinear arms 42 and 44 through corresponding directional isolators 62 and 64 to corresponding power detectors 66 and 68. Any type of power detector, such as a thermistor or a square-law crystal detector, can be used at 66 and 68.

It should be noted that although an adjustable waveguide short circuit 56 is illustrated in the phase shifter 60, other forms of phase shifters could be used. For example, a circulator or a 3 dB hybrid could replace the magic tee, or an electronic phase shifting structure consisting of a combination of a PIN diode with the magic tee could be used.

The outputs from the power detectors 66 and 68 are supplied by way of lines 70 and 72, respectively, to the computer 28 for calculation of the impedance characteristics of the device under test. These calculations are made by solving the mathematical equations (algorithms) for these values. Thus, the reference signal $V_r$ and the test signal $V_t$ are expressed in the following general form:

$$V_r = T_r(f)V_i + T_r(f)\cdot D_r(f)\Gamma V_i$$

$$V_t = T_t(f)\cdot\Gamma V_i + T_t(f)D_t(f)V_i \tag{1}$$

where $T_r$ and $T_t$ are transmission coefficients of the reference and test channels, respectively, the D's are the directivity of the corresponding couplers and $\Gamma(=|\Gamma|e^{j\theta})$ is the complex reflection coefficient of the device under test 24. The f's in parentheses are included to emphasize that the quantities are frequency dependent.

The second terms in each of the above equations represent coupler imperfections which cause errors in measurement. Note that the second term of the first equation becomes important compared to the first term when $|\Gamma D_r|$ is comparable to or greater than unity. The second term in the second equation becomes significant when $|\Gamma|$ becomes comparable to $|D_t|$. These second terms will limit the accuracy of measurement if they are not included in the formulation.

For simplicity in the following formulation, however, these second terms are excluded. In this case the output dc voltage $V_1$ from power detector 66 is expressed as follows:

$$\begin{aligned} V_1 &= S_1(f)P_1 \qquad (2) \\ &= S_1(f)|b_{r1}(f)T_r(f)\cdot V_i + b_{t1}(f)T_t(f)\cdot V_i\Gamma|2 \\ &= S_1(f)|\ |b_{r1}T_rV_i| + |b_{t1}T_tV_i|\cdot|\Gamma|e^{j(\theta+\theta_{t1}-\theta_{r1})}|2 \\ &= |S_{r1}(f) + S_{t1}(f)\cdot\Gamma\, e^{j(\theta+\theta_1)}|^2 \end{aligned}$$

where $S_{r1}(f)=\sqrt{S_1(f)}|b_{r1}T_rV_i|$, $S_{t1}(f)=\sqrt{S_1(f)}|b_{t1}T_tV_i|$, $\theta_1=\theta_{t1}-\theta_{r1}1$ The coefficients $b_{r1}$, $b_{t1}$ represent the power splitting characteristics of the magic tee and ideally take a value of $1/\sqrt{2}$ in magnitude. Note that in the last line of Eq. (2) a sign for absolute value has been removed from Γ for brevity.

The dc output voltage $V_2$ from detector 68 is written in a similar form with the positive sign in front of the second term being replaced by a negative sign in Eq. (2). This is because a phase inversion occurs in the magic tee when the signal is incident on its E-arm. Thus $$V_2 = |S_{r2}(f) - S_{t2}(f)\cdot\Gamma e^{j(\theta+\theta_2)}|2 \tag{3}$$

It should be noted that any deviation from an ideal phase inversion, in a practical magic tee, is accounted for in $\theta_2$.

Equations (2) and (3) can be written in the following form:

$$V_1 = S_{r1}^2 + S_{t1}^2\cdot\Gamma^2 + 2S_{r1}S_{t1}\cdot\Gamma\cos(\theta+\theta_1)$$

$$V_2=S_{r2}^2+S_{t2}^2\Gamma^2-2S_{r2}S_{t2}\Gamma\cos(\theta+\theta_2) \quad (4)$$

or $$\alpha_o\Gamma^2+2\Gamma\cos(\theta+\theta_1)=\frac{V_1}{S_{r1}S_{t1}}-\frac{1}{\alpha_o}=c_o \quad (5)$$

$$B_o\Gamma^2-2\Gamma\cos(\theta+\theta_2)=\frac{V_2}{S_{r2}S_{t2}}-\frac{1}{\beta_o}=d_o \quad (6)$$

where $\alpha_o=S_{t1}/S_{r1}$ and $\beta_o=S_{t2}/S_{r2}$.

Since each of these equations is two-valued in terms of $\Gamma$ and $\theta$ ($-\pi\leqq\theta\leqq+\pi$,) two additional independent equations are required for a unique determination of $\Gamma$ and $\theta$. These additional equations can be provided by introducing an extra phase shift, $\Delta\theta$, in the reference signal $V_r$ by switching the phase shifter 60, as by moving the short circuit 56 or by turning a PIN diode from OFF to ON. The following additional set of equations is then obtained.

$$a\Gamma^2\,2\Gamma\cos(\theta+\theta_1-\Delta\theta)=\frac{V_1}{S'_{r1}S_{t1}}-\frac{1}{\alpha}=c \quad (7)$$

$$\beta\Gamma^2-2\Gamma\cos(\theta+\theta_2-\Delta\theta)=\frac{V_2}{S'_{r2}S_{t2}}-\frac{1}{\beta}=d \quad (8)$$

The values of $\Gamma$ and $\theta$ of an unknown device 24 are determined from Eqs. (5)-(8), provided that all the system parameters, $\alpha$'s, $\beta$'s, etc., have been determined. Elimination of $\theta$ from Eqs. (5) and (6) yields:

$$\Gamma^4[a_o^2+\alpha_o^2\sin^2\Delta\psi]-2\Gamma^2[2\sin^2\Delta\psi+a_ob_o+\alpha_oc_o\sin^2\Delta\psi]+[b_o^2+c_o^2\sin^2\Delta\psi]=0 \quad (9)$$

where $a_o=\alpha_o\cos\Delta\psi+\beta_o, b_o=c_o\cos\Delta\psi+d_o$, and $\Delta\psi=\theta_2-\theta_1$.

A similar equation is obtained from Eqs. (5) and (7):

$$\Gamma^4[p^2+\alpha_o^2\sin^2\Delta\theta]-2\Gamma^2[2\sin^2\Delta\theta+pq+\alpha_oc_o\sin^2\Delta\theta]+[q^2+c_o^2\sin^2\Delta\theta]=0 \quad (10)$$

where $p=\alpha_o\cos\Delta\theta-\alpha$ and $q=c_o\cos\Delta\theta-c$

Combining Eqs. (9) and (10) yields a linear equation for $\Gamma^2$.

$$2\Gamma^2\left[\begin{array}{l}(p^2+\alpha_o^2\sin^2\Delta\theta)(2\sin^2\Delta\psi+a_ob_o+\alpha_oc_o\sin^2\Delta\psi)\\-(a_o^2+\alpha_o^2\sin^2\Delta\psi)(2\sin^2\Delta\theta+pq+\alpha_oc_o\sin^2\Delta\theta\end{array}\right]= \quad (11)$$

$$(p^2+\alpha_o^2\sin^2\Delta\theta)(b_o^2+c_o^2\sin^2\Delta\psi)-(q^2+c_o^2\sin^2\Delta\theta)(a_o^2+\alpha_o^2\sin^2\Delta\psi)$$

After the value of $\Gamma^2$ is found, $\theta$ can be determined from the following equation, derived from Eqs. (5) and (7):

$$\tan(\theta+\theta_1)=\frac{1}{\sin\Delta\theta}\left[\frac{c-\alpha\Gamma^2}{c_o-\alpha_o\Gamma^2}-\cos\Delta\theta\right] \quad (12)$$

The unique determination of $\theta$ is extracted by examining the sign of $\cos(\theta+\theta_1)$ or $(c_o-\alpha_o\Gamma 2)$. This formulation reduces the measurement error in $\theta$ as compared to a direct solution of Eqs. (5) or (6).

The equations for transmission coefficient measurements are obtained by simply replacing T, the transmission coefficient, for $\Gamma$ in all the equations derived above.

The computer 28 performs the foregoing calculation to determine the complex reflection coefficient $\Gamma$ and the phase shift $\theta$ produced by the device under test for any given incident frequency. The calculated values are supplied by the computer through line 74 to suitable display devices such as a cathode ray tube 76, a pen recorder 78, or a printer 80. Upon completion of a calculation, the signal generator 10 is shifted to the next desired frequency by a signal from the computer on line 26 and the measurements and calculations repeated.

Figure 2:
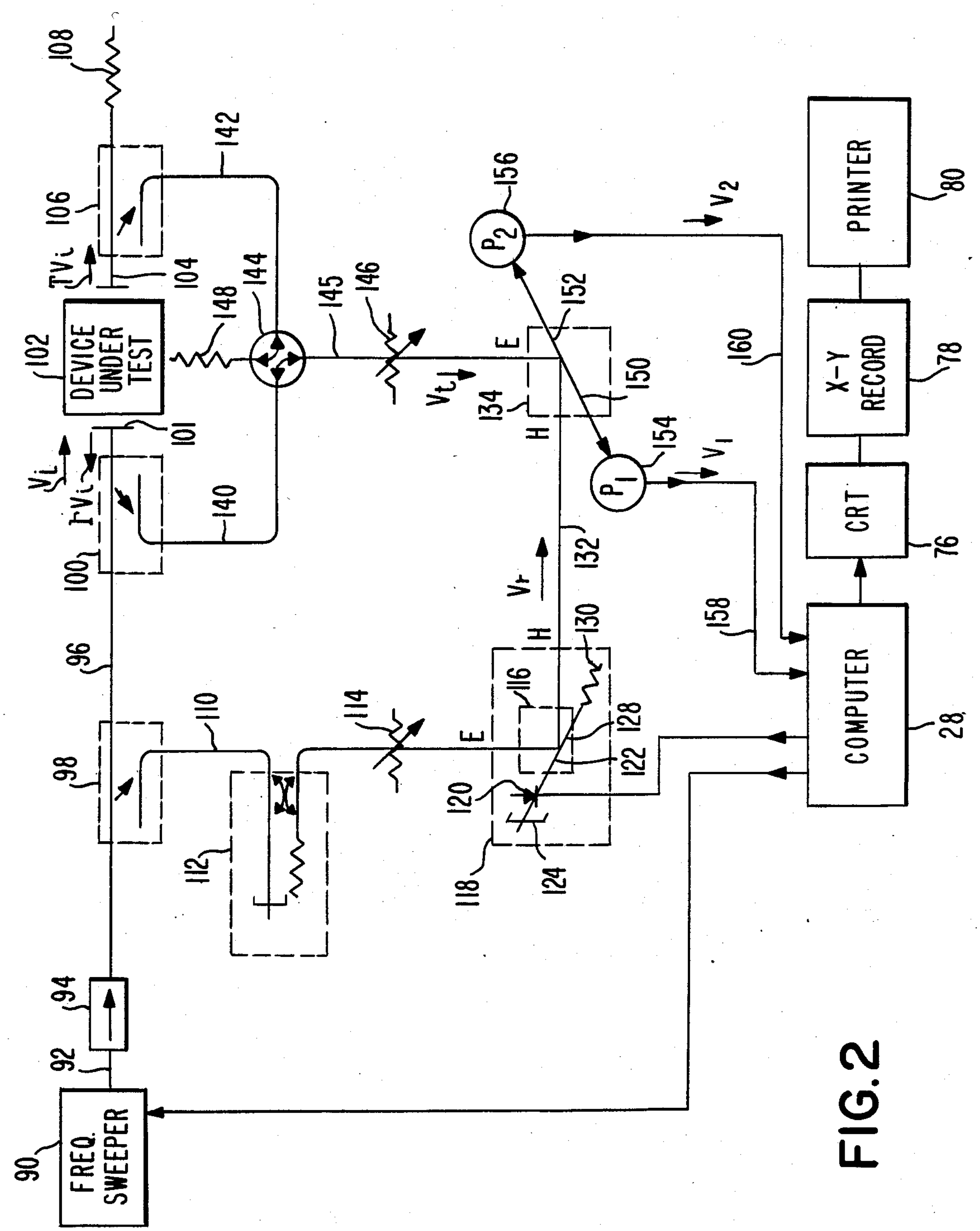
FIG. 2 is a modified schematic diagram of the vector network analyzer of FIG. 1, adapted for measurement of either reflection or transmission coefficients.

A modification of the system of FIG. 1 is illustrated in FIG. 2, wherein a variable frequency signal generator 90 supplies output signals of selected frequencies in the millimeter wavelength range on output waveguide 92. These output signals are supplied through a directional isolator 94 and a waveguide 96, which incorporates a pair of directional couplers 98 and 100, to a test port 101, to which is connected a device under test 102, the signal generator 90 supplying an incident voltage $V_i$ to the device 102. Reflections from the device 102 are represented by $\Gamma V_i$, while signals transmitted through the device under test are represented at its output at waveguide 104 by the signal $TV_i$. In the test system, the output signal is fed through a directional coupler 106, to a terminating attenuator 108.

The first directional coupler 98 couples a portion of the incident signal $V_i$ appearing on waveguide 96 to a reference channel waveguide 110, which includes an adjustable extension 112 to permit equalization of the path lengths of the reference and test channels to minimize errors due to any frequency instability in the signal generator 90. The reference channel waveguide also includes an adjustable attenuator 114 to permit adjustment of the amplitude of the signal in the reference channel 110. The signal from waveguide 110 is supplied to the E arm of a magic tee device 116 which is a part of a 90° phase shifter 118. In this embodiment, a PIN diode 120 is connected in the arm 122 of the magic tee 116, the conductivity of the diode being controlled by the computer 28. Thus, the PIN diode 120, which is backed by a short circuit 124, is shiftable between on and off conditions to provide a 90° phase shift in the signals appearing on the H arm of the magic tee 16. The colinear arm 128 incorporates a terminating attenuator 130.

The output signal from the H arm of magic tee 116 is the reference voltage $V_r$ which is supplied by way of waveguide 132 to the H arm of a magic tee 134 in the test channel of the system.

The device under test 102 in FIG. 2 may be tested for both reflection and transmission coefficients, and for this purpose the directional coupler 100 samples the reflected signals $\Gamma Vi$ reflected from the device under test and couples those signals to a reflection test arm which includes waveguide 140. Signals that are transmitted through the device under test 102 are represented by voltage $TV_i$ and are sampled by the directional coupler 106 to supply test signals to the transmission test arm which includes waveguide 142. A switch 144 allows the signal on either of the waveguides 140 or 142 to be directed through a test channel waveguide 145, which includes an adjustable attenuator 146, to the E arm of the magic tee 134, the signal so selected constituting the test voltage $V_t$. The one of the transmission or reflection signals not selected for connection to waveguide 145 is shunted to a terminating impedance 148, connected to the switch 144.

As previously explained with respect to FIG. 1, the signals $V_t$ and $V_r$ are mixed in the magic tee device 134, and output signals are produced on the colinear arms 150 and 152 and are fed to power detectors 154 and 156, respectively. It will be understood that in conventional manner the signals on arms 150 and 152 represent the vectorial mixing of the signals $V_t$ and $V_r$. The output of the power detectors 154 and 156 are supplied by way of lines 158 and 160, respectively, to the computer 28, which calculates the reflection or transmission coefficients of the device under test for any selected incident frequency. The computer provides real time data processing and the results of its calculations are displayed immediately on a suitable output device such as a cathode ray tube 76, an X-Y recorder 78, or a printer 80, as previously discussed. Although the device of FIG. 2 is simplified in some respects, it will be understood that additional directional isolators, attenuators, frequency meters, and the like may be provided as required. These additional devices have not been illustrated in FIG. 2 for purposes of clarity.

Before the systems of FIG. 1 or 2 can be used in measuring the characteristics of a device to be tested, it is necessary to calibrate the system. Thus, to calibrate the computer-aided magic tee vector network analyzer of the present invention, the values of system parameters $S_r$'s, $S_t$'s, $\theta_1$, $\theta_2$, and $\Delta\theta$ must be determined. There are three steps in the calibration procedure:

Step 1 (determines the $S_r$'s)

$S_{r1}$, $S_{r2}$, and $S'_{r1}$, $S'_{r2}$ for the PIN set to OFF and ON conditions respectively are calibrated as proportional to $\sqrt{V_1}$ and $\sqrt{V_2}$, with $V_t$ set to zero by miximizing the attenuation in the test channel. For example, $V_1=S_{r1}^2$ and $V_2=S_{r2}^2$ with the PIN diode OFF.

Step 2 (determines the $S_t$'s)

A reference short circuit replaces the device under test at test ports 25 or 101 so that $\Gamma=1$. $S_{t1}$ and $S_{t2}$ are then calibrated as proportional to $\sqrt{V_1}$ and $\sqrt{V_2}$ respectively, with the value of $V_r$ set to zero by maximizing the attenuation in the reference channel 46 or 110. The values of $\alpha$'s and $\beta$'s are the calculated.

Step 3 (determines $\theta_1$ and $\theta_2$)

With both the test and the reference channels 36 and 46, or 145 and 110, open, $V_1$ and $V_2$ or $c_o$ and $d_o$ are measured with the PIN diode set to OFF. This is done for two different reference short circuit lengths connected to the test port 25 or 101; one with $\theta=\pi$ and the other with $\theta=\pi-4\pi R/\lambda_g$. Typically R is chosen to be close to one eighth of $\lambda_g$, the guided wavelength, so that $\theta_o(=-4\pi R/\lambda_g)$ is about $-90$ /2.

From Eq. (5), we have:

$$2\cos\theta_1=\alpha_o-c_o \text{ for } \theta=\pi$$

$$2\cos(\theta_o+\theta_1)=\alpha_o-c'_o \text{ for } \theta=\pi+\theta_o \quad (13)$$

Thus, $$\tan\theta_1=\frac{1}{\sin\theta_o}\left[\cos\theta_o-\frac{c_o'-\alpha_o}{c_o-\alpha_o}\right] \quad (14)$$

The value of $\theta_1$ is uniquely determined by examining the sign of $\cos\theta_1$ or $(\alpha_o-c_o)$. A similar equation is obtained for $\theta_2$:

$$\tan\theta_2=\frac{1}{\sin\theta_0}\left[\cos\theta_0-\frac{d_o'-\beta_o}{d_o-\beta_o}\right] \quad (15)$$

Step 4 (determines $\Delta\theta$)

With the PIN diode ON, $V_1$ and $V_2$ are measured for the two different lengths of reference short circuits connected to the test port.

From Eq. (17), we have:

$$2\cos(\theta_1-\Delta\theta)=\alpha-c$$

$$2\cos(\theta_o+\theta_1-\Delta\theta)=\alpha-c' \quad (16)$$

Thus $$\tan(\theta_1-\Delta\theta)=\frac{1}{\sin\theta_o}\left[\cos\theta_o-\frac{c'-\alpha}{c-\alpha}\right] \quad (17)$$

The system calibration for transmission coefficient measurements follows the same steps as above except that the use of the two reference short circuits, described in Steps 3 and 4, is omitted. A direct connection and an insertion of a quarter-wavelength through-waveguide between the input and output test ports are used as the reference, instead. It should also be noted that as an alternate procedure, the reference channel can simply be extended by a quarter wavelength instead of connecting the length of the reference short circuit, or the through-waveguide, to the test port.

Figure 3:
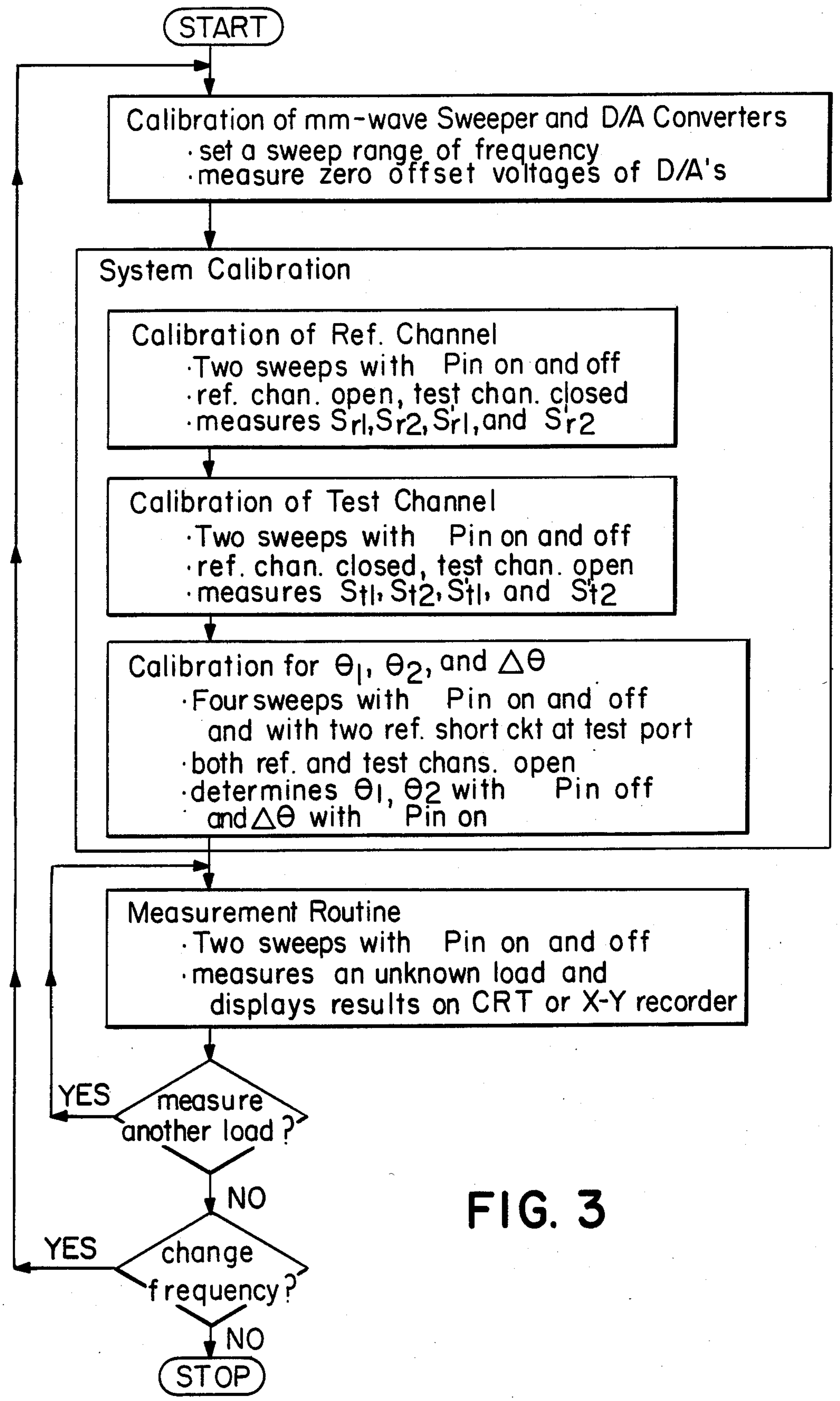
FIG. 3 is a flow chart showing the calibration and testing procedures used in the present network analyzer.

FIG. 3 is a diagrammatic illustration of the measuring process followed in operation of the vector network analyzer of the present invention. As shown, the first step in the system operation is calibration of the signal generator 10 or 90. This generator incorporates digital to analog converters which produce a zero offset when a sweep range of frequency is selected. This offset must be measured and compensated. The sweep frequency range to be covered in a particular test sequence is selected in this step, and is divided into 101 equally separated points in a preferred method of operating the system for point-by-point measurements and calculation.

The entire test system is next calibrated in accordance with the three steps outlined above, wherein the values of $S_r$, $S_t$ and $\theta$ are determined. In the illustrated procedure, the reference channel is calibrated by sweeping the 101 selected test points twice, once with the PIN diode on and once with it off. This is done with the reference channel open and the test channel closed. This is followed by two sweeps of the 101 measuring points, once with the PIN diode on and once with it off, this time with the reference channel closed and the test channel open. Finally, calibration for $\theta$ is obtained with four sweeps with the PIN diode on or off and with two reference short circuits at the test port, with both the reference and the test channels open. A complete system calibration thus requires eight frequency sweeps and, in a prototype unit which has been constructed and operated, required a time period which was limited principally by the slow response time of the power detector thermistors. This calibration time can be reduced through the use of square-law crystal detectors.

Upon completion of the calibration, the measurement of the unknown device under test can be conducted and a display of the results produced. The device is connected into the system and two frequency sweeps of the 101 points are required, once with the PIN diode on, and once with it off, to complete a measurement of either reflection or transmission characteristic. Quasi-real time displays of results can be achieved through the use of the PIN diode phase shifter with square-law crystal detectors, but cannot be achieved if mechanical phase shifters and thermistor power detectors are used because of the slow reaction time of the thermistors and the delays encountered in shifting the mechanical devices.

Figure 4:
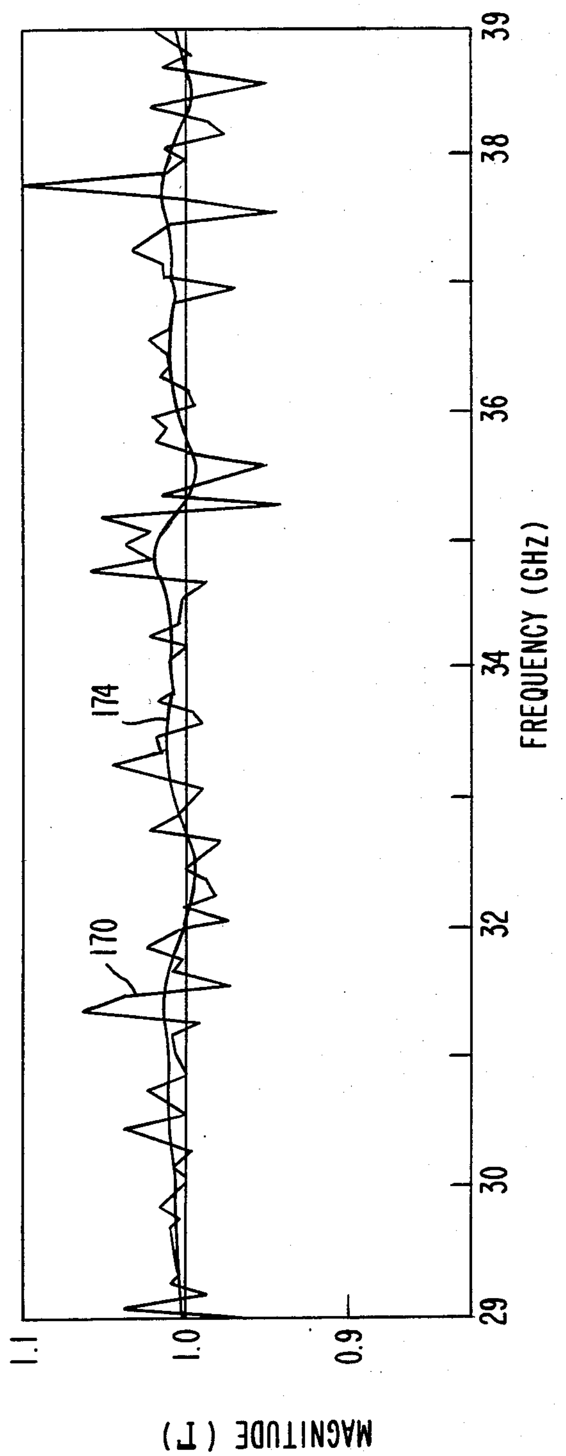
FIGS. 4, 5 and 6 are charts of results obtained with the analyzer of the present invention.
Figure 5:
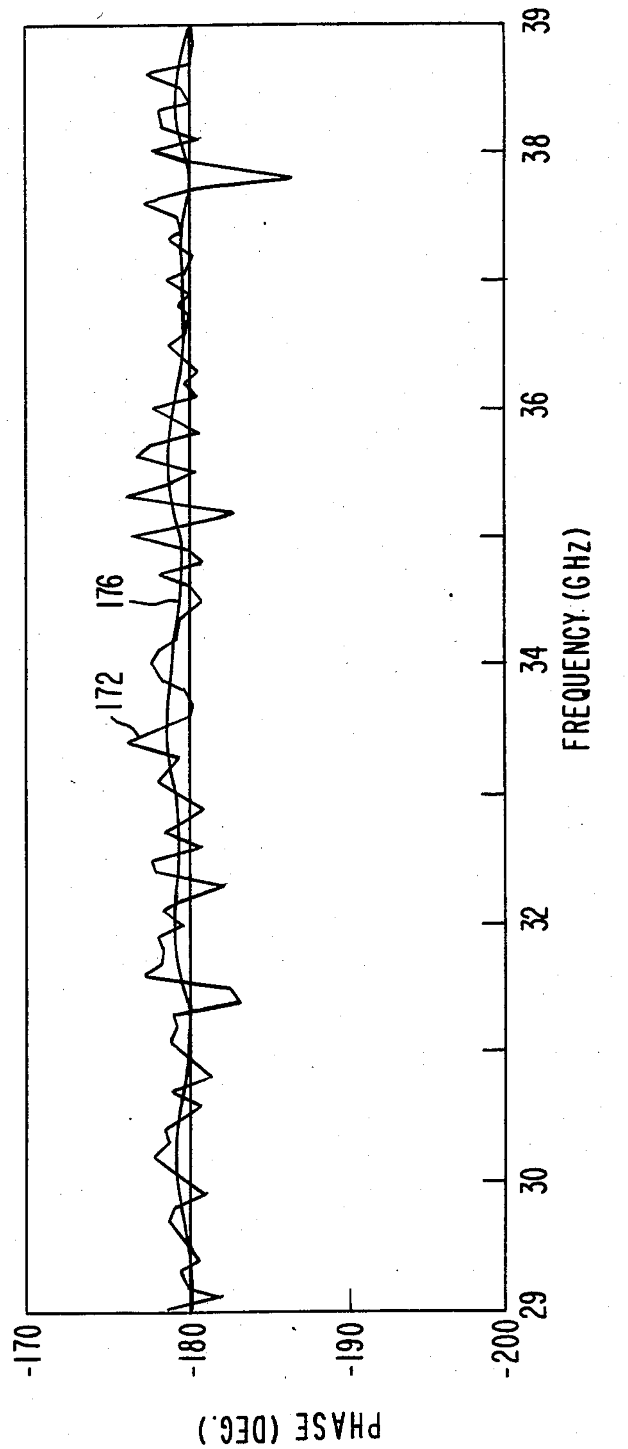

FIGS. 4 and 5 are examples of measurements in which the reflection coefficients of a wave guide short circuit was measured over a frequency range of 29 to 39 GHz. The curve 170 in FIG. 4 and the curve 172 in FIG. 5 indicate the raw data of the measurements of magnitude and phase, respectively. Smoothing of the data was performed by taking a weighted average of the measurements around a frequency of interest, and this data is shown by the curves 174 and 176, respectively. This smoothing was found to be an effective way of reducing errors caused by the finite directivity of the directional couplers. The measured results are repeatable and the maximum deviations from the expected values are ±0.16 dB in magnitude and ±1.2° in phase over the entire frequency range.

Figure 6:
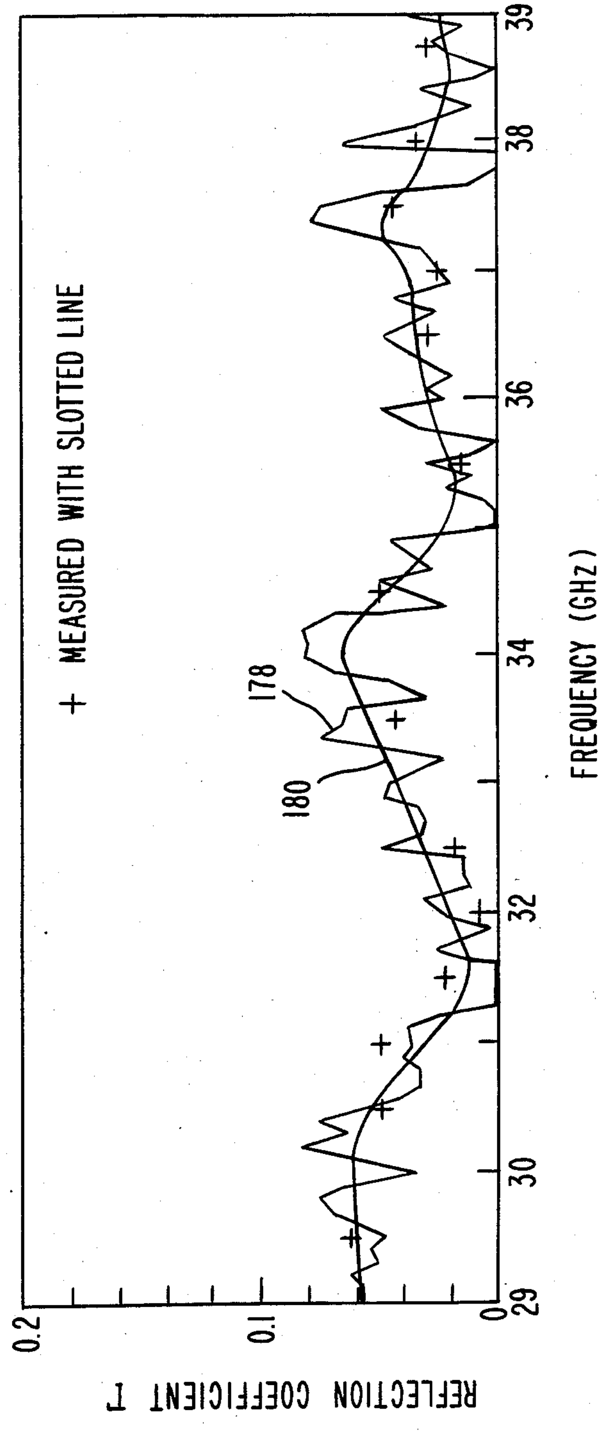

FIG. 6 is another example of measurements in which the reflection coefficient of a commercial waveguide matched termination was measured. The curves 178 and 180, respectively, indicate the raw and the smoothed data of measurements of magnitude. This data agrees well with the results obtained by using a standard technique, which are indicated by plus marks in the same figure.

Thus, there has been shown a new computer-aided millimeter vector network analyzer which provides an accurate, fast, and cost-effective way of measuring complex reflection and transmission coefficients of an unknown test device, on a swept frequency basis. The operation of the analyzer makes use of the special properties of a magic tee, and only a few other standard waveguide components, including two directional couplers, two power detectors, and a 90° electronic phase shifter, are required. Computations of device characteristics based on the outputs of the power detectors are rapid, enabling real time data processing and enhanced accuracy. Further, quasi-real time display of measured results is possible by incorporating an electronically controlled phase shifter and crystal power detectors.

The computer control is simple and the calculations take into consideration errors that occur in the system, in part through the use of complementary computer algorithms for determinations of the magnitude of the reflection/transmission coefficients. Although the invention has been shown and described in terms of preferred embodiments, it will be apparent that additional modifications may be made without departing from the true spirit and scope thereof as set forth in the following claims.

What is claimed is:

1. A millimeter wave vector network analyzer, comprising:

a source of millimeter wave signals;

waveguide means for directing said signals onto a device to be tested;

a first directional coupler connected to said waveguide means for providing a reference sample of the signal incident on said device;

a reference waveguide channel for receiving said reference sample;

a second directional coupler connected to said waveguide means for providing a test sample of the signal reflected from said device;

a test waveguide channel for receiving said reflected signal test sample; a magic tee hybrid, having two inputs and two outputs;

controllable phase shifter means connected in at least one of said reference and test waveguide channels;

means connecting said reference channel to a first input of said hybrid to direct said reference sample to said hybrid;

means connecting said test channel to a second input of said hybrid to direct said test sample to said hybrid, said hybrid combining said reference and said test samples vectorially;

first and second power detectors connected to first and second outputs, respectively, of said hybrid, said power detectors providing scalar information which is a function of the magnitude of the reflection coefficient of said device and the phase of the reflection coefficient of said device; and means responsive to said scalar information to provide the phase and magnitude of the reflection coefficient of said device.

2. The analyzer of claim 1, further including output waveguide means receiving signals transmitted through said device from said source;

a third directional coupler connected to said output waveguide means for providing a test sample of the signal transmitted through said device; and switch means for selectively directing said transmitted signal test sample or said reflected signal test sample into said test waveguide, whereby said power detectors provide amplitude and phase information about the transmission or reflection coefficients, respectively, of said device.

3. The analyzer of claim 1, where said source is a variable frequency signal generator for producing millimeter wave signals over a selected frequency band.

4. The analyzer of claim 3, wherein said variable frequency signal generator produces signals in the range of 20–100 GHz.

5. The analyzer of claim 1, further including variable attenuator means connected in at least one of said reference and said test waveguide channels.

6. The analyzer of claim 1, wherein said phase shifter is connected to said reference waveguide channel.

7. The analyzer of claim 6, wherein said phase shifter comprises an electronically controlled PIN diode in one colinear arm of a second magic tee hybrid.

8. The analyzer of claim 6, wherein said means responsive to said scalar information includes computer means responsive to said first and second power detectors for computing amplitude and phase coefficients for said device.

9. The analyzer of claim 6, wherein said source is a variable frequency signal generator for producing millimeter wave signals over a selected frequency band, and further including computer means controlling said signal generator to select the frequency of said millimeter wave signals.

10. The analyzer of claim 9, further including means for turning said phase shifter on and off, selectively.

11. The analyzer of claim 10, wherein said means for turning said phase shifter on and off comprises said computer means.

12. The analyzer of claim 2, wherein said source is a variable frequency signal generator for producing millimeter wave signals over a selected frequency band.

13. The analyzer of claim 12, wherein said phase shifter means is connected in said reference waveguide channel.

14. The analyzer of claim 13, wherein said phase shifter comprises an electronically controlled PIN device in one colinear arm of a second magic tee hybrid.

15. The analyzer of claim 14, further including computer means for selecting the frequency of said source, for activating said switch means for selecting one of said test samples, for controlling said PIN device and for computing, from the outputs of said power detectors, the impedance coefficients of said device.

16. A millimeter wave vector network analyzer, comprising:

a source of millimeter wave signals;

waveguide means for directing said signals onto a device to be tested;

a first directional coupler connected to said waveguide means for providing a reference sample of the signal incident on said device;

a reference waveguide channel for receiving said reference sample;

a second directional coupler connected to said waveguide means for providing a test sample of any signal transmitted through said device;

a test waveguide channel for receiving said transmitted signal test sample;

controllable phase shifter means connected in at least one of said reference and test waveguide channels;

a magic tee hybrid, having two inputs and two outputs;

means connecting said reference channel to a first input of said hybrid to direct said reference sample to said hybrid;

means connecting said test channel to a second input of said hybrid to direct said test sample to said hybrid, said hybrid combining said reference and said test samples vectorially;

first and second power detectors connected to first and second outputs, respectively, of said hybrid, said power detectors providing scalar information which is a function of the magnitude of the transmission coefficient of said device and the phase of the transmission coefficient of said device; and means responsive to said scalar information to provide the phase and magnitude of the transmission coefficient of said device.

17. The analyzer of claim 16, wherein said source is a variable frequency signal source for producing millimeter wave signals over a selected frequency band, and further including means for controlling said source to produce a signal having a selected frequency.

18. The analyzer of claim 1, wherein said source is a variable frequency signal source for producing millimeter wave signals over a selected frequency band, and further including means for controlling said source to produce signals having a selected frequency.

19. The analyzer of claim 18, further including means to control said phase shifter.

20. The analyzer of claim 19, wherein said phase shifter is connected in only said reference waveguide channel.

21. The analyzer of claim 16, further including variable attenuator means connected in at least one of said reference and said test waveguide channels.

* * * * *